United States Patent [19]
Soejima

[11] Patent Number: 5,811,873
[45] Date of Patent: Sep. 22, 1998

[54] DIODE HAVING SOFT RECOVERY CHARACTERISTICS OVER A WIDE RANGE OF OPERATING CONDITIONS

[75] Inventor: Noriyuki Soejima, Fukuoka, Japan

[73] Assignee: Mitsubishi Denki Kabushiki Kaisha, Tokyo, Japan

[21] Appl. No.: 562,457

[22] Filed: Nov. 24, 1995

[30] Foreign Application Priority Data

May 18, 1995 [JP] Japan ................................. 7-120105

[51] Int. Cl.$^6$ ..................... H01L 29/167; H01L 29/207; H01L 29/227; H01L 29/36
[52] U.S. Cl. .......................................... 257/655; 257/657
[58] Field of Search ................................. 257/655, 657

[56] References Cited

U.S. PATENT DOCUMENTS

| | | |
|---|---|---|
| 3,921,192 | 11/1975 | Goronkin et al. . |
| 4,594,602 | 6/1986 | Iimura et al. . |
| 5,627,402 | 5/1997 | Takemura ............................. 257/596 |

FOREIGN PATENT DOCUMENTS

| | | |
|---|---|---|
| 0103138 A2 | 3/1984 | European Pat. Off. . |
| 0 368 768 | 5/1990 | European Pat. Off. . |
| 0 614 231 | 9/1994 | European Pat. Off. . |

OTHER PUBLICATIONS

Patent Abstracts of Japan, JP 62–115880, May 27, 1987.
Patent Abstracts of Japan, JP 58–216473, Dec. 16, 1983.
Patent Abstracts of Japan, JP 4–67687, Mar. 3, 1992.
"Analysis of Soft Recovery of Diode and the 2 Step Gradient Structure" by H. Hagino & N. Soejima The Transactions of the Institute of Electrical Engineers of Japan, vol. 115–C, No. 6, published on May 20, 1995.

*Primary Examiner*—Ngân V. Ngô
*Attorney, Agent, or Firm*—Oblon, Spivak, McClelland, Maier & Neustadt, P.C.

[57] ABSTRACT

A diode has a semiconductor layer which has a predetermined impurity concentration, and in which the rate of extension of a depletion layer during a reverse recovery operation gradually decreases so as to decrease the rate of change in reverse recovery current. In addition, the number of excess carriers accumulated in the semiconductor layer during a forward operation is decreased so as to decrease reverse recovery charge. The diode generates less surge voltage and loss and can comply with operating conditions of various forward current densities, and various reverse voltages.

5 Claims, 13 Drawing Sheets

$(Db \geq \overline{W})$

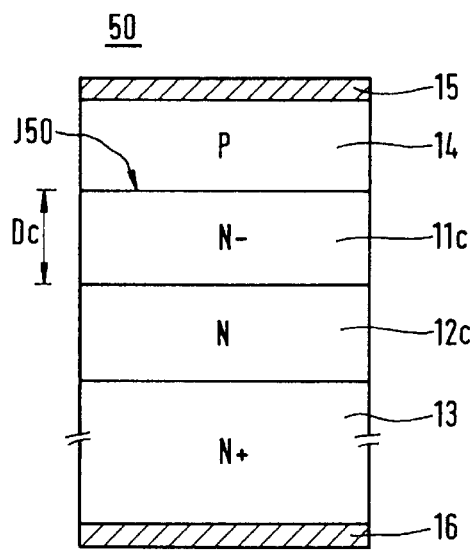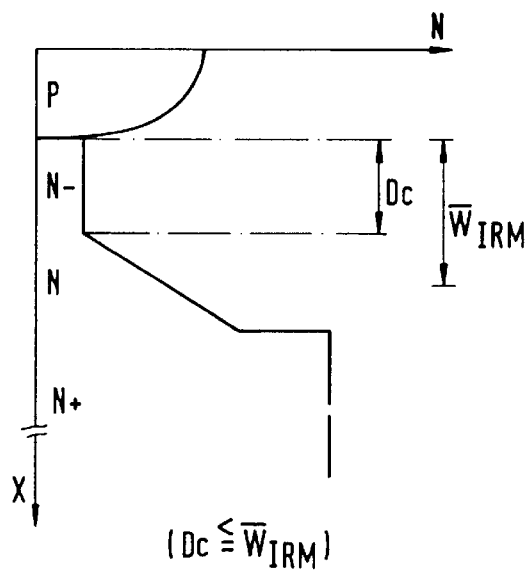
FIG. 5(a)
FIG. 5(b)
$(D_c \leqq \overline{W}_{IRM})$

FIG. 6(a)
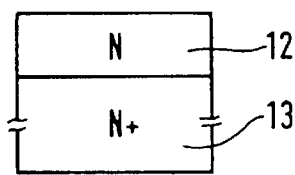
FIG. 6(a')
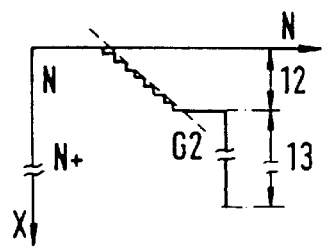
FIG. 6(b)
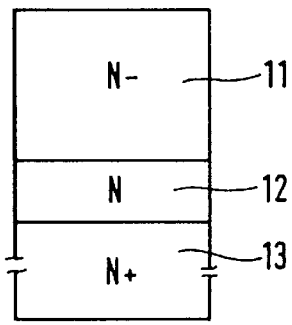
FIG. 6(b')
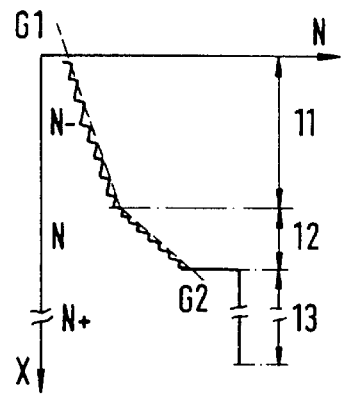
FIG. 6(c)
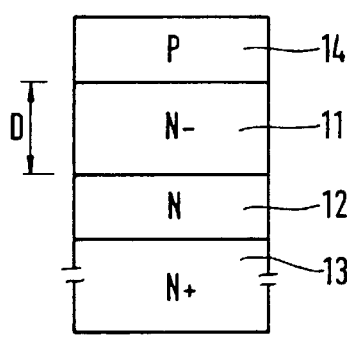
FIG. 6(c')
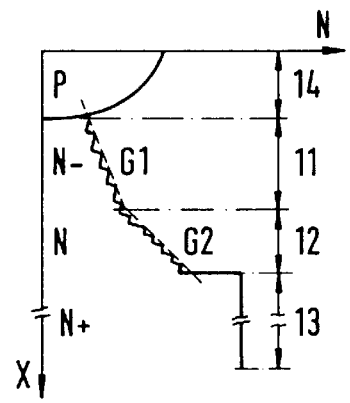
FIG. 6(d)
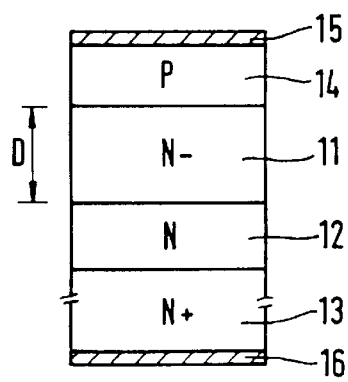

FIG. 7(a)         FIG. 7(a')
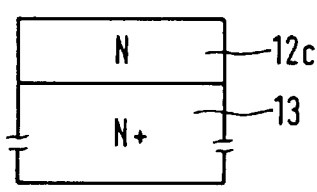 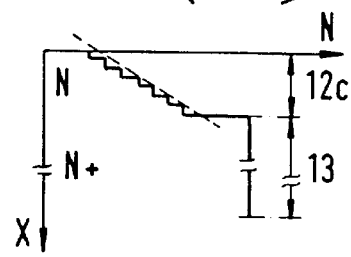
FIG. 7(b)         FIG. 7(b')
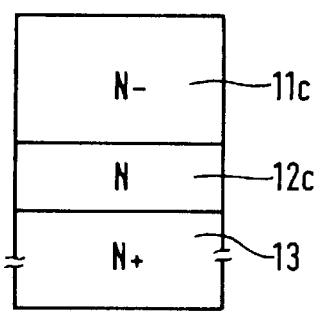 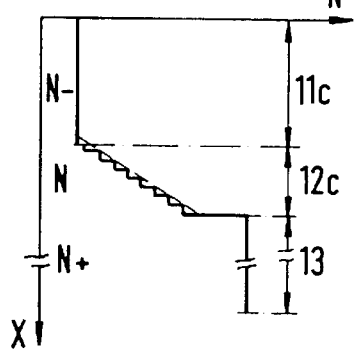
FIG. 7(c)         FIG. 7(c')
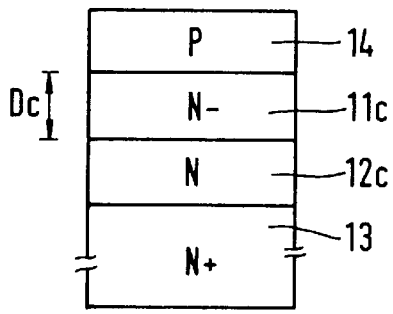 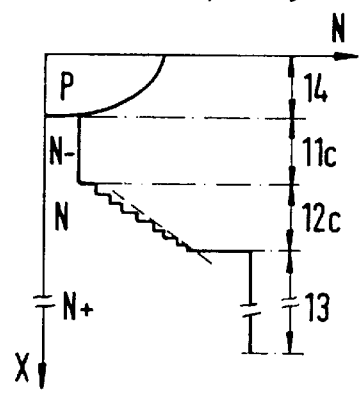
FIG. 7(d)
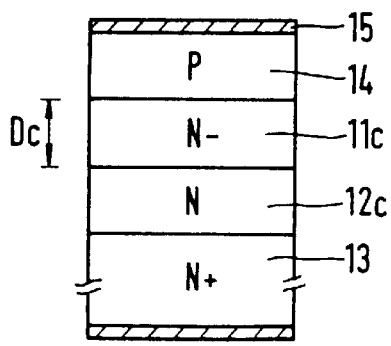

FIG. 8(a)
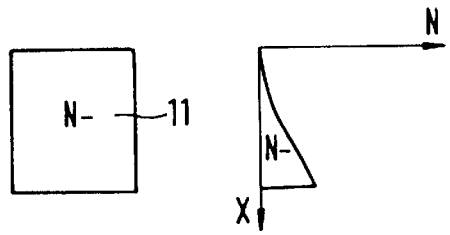
FIG. 8(a')
FIG. 8(b)
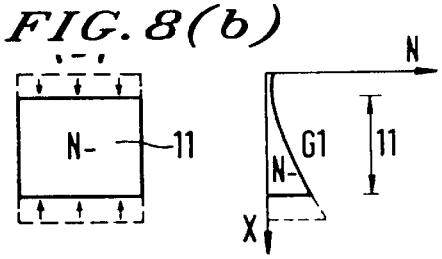
FIG. 8(b')
FIG. 8(c)
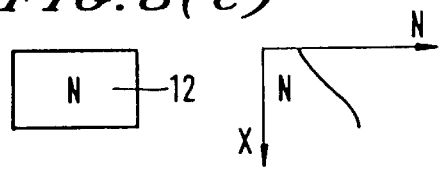
FIG. 8(c')
FIG. 8(d)
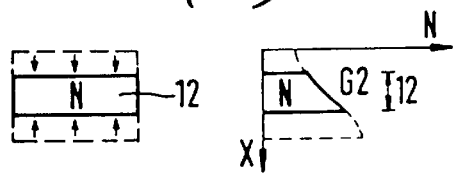
FIG. 8(d')
FIG. 8(e)
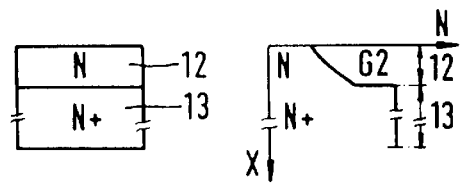
FIG. 8(e')
FIG. 8(f)
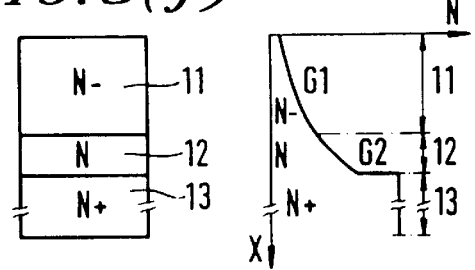
FIG. 8(f')
FIG. 8(g)
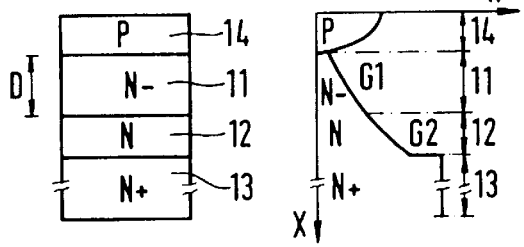
FIG. 8(g')
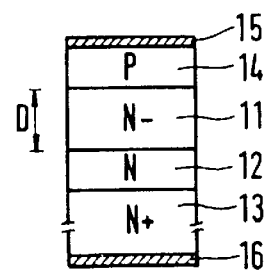
FIG. 8(h)

FIG. 9(a)
FIG. 9(a')
FIG. 9(b)
FIG. 9(b')
FIG. 9(c)
FIG. 9(c')
FIG. 9(d)
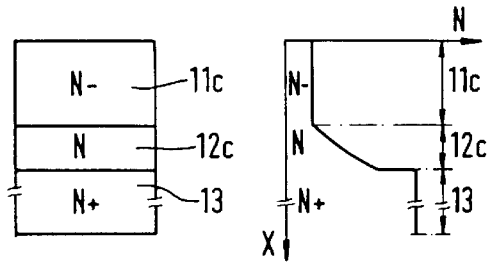
FIG. 9(d')
FIG. 9(e)
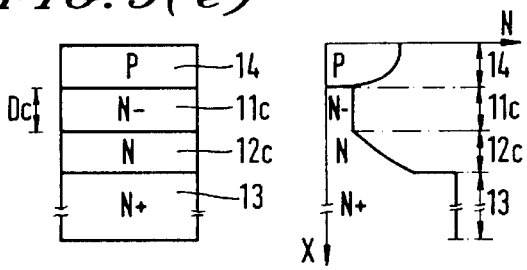
FIG. 9(e')
FIG. 9(f)
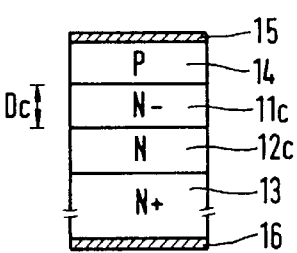

FIG. 10(a)
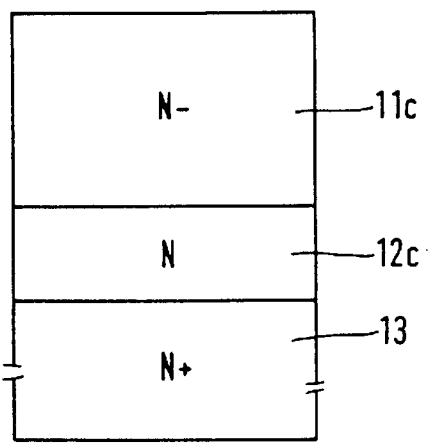
FIG. 10(a')
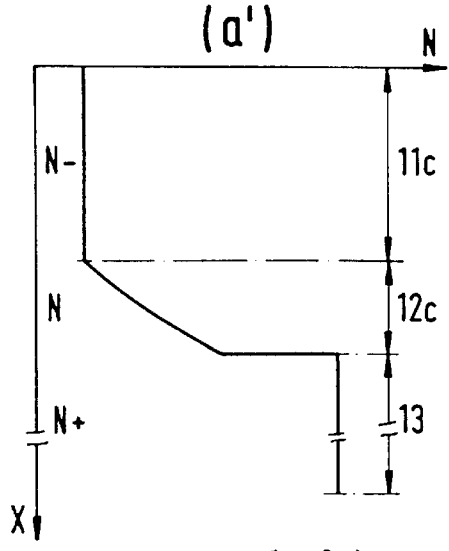
FIG. 10(b)
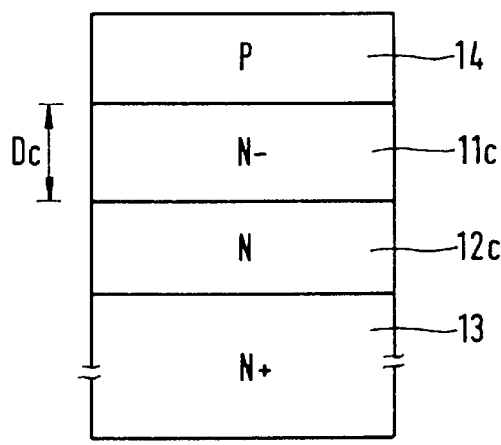
FIG. 10(b')
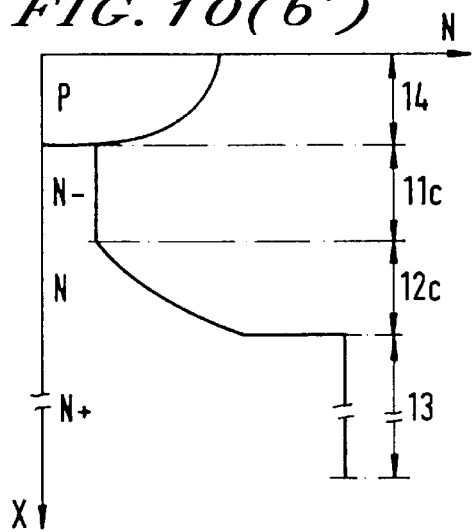
FIG. 10(c)
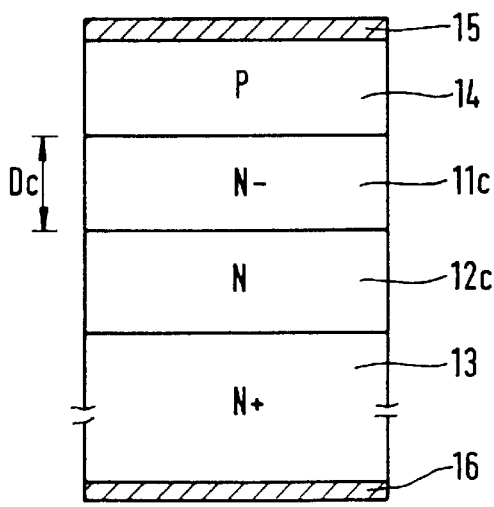

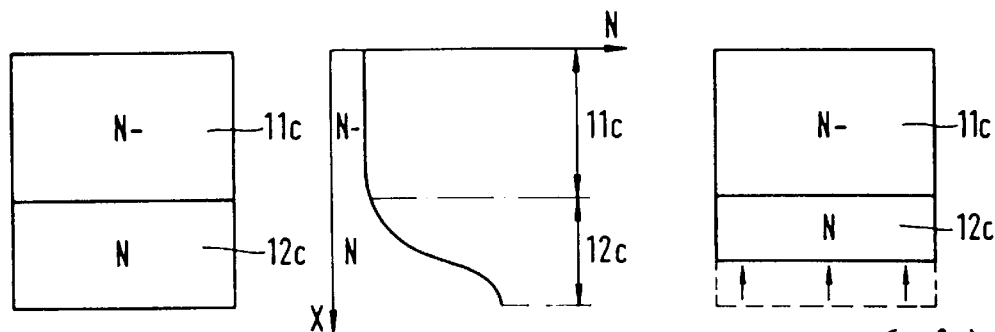
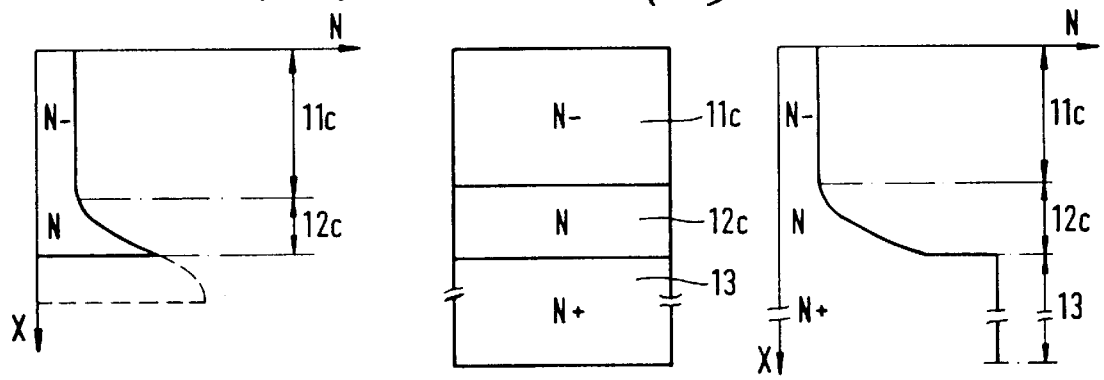
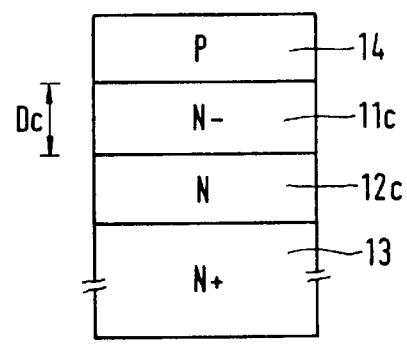
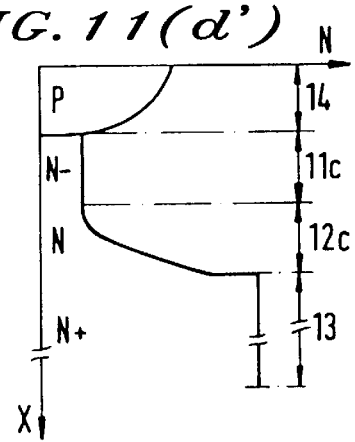
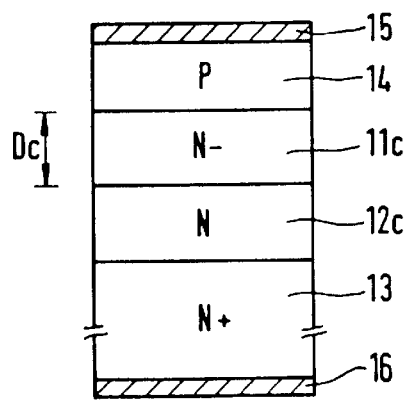

FIG. 12(a)
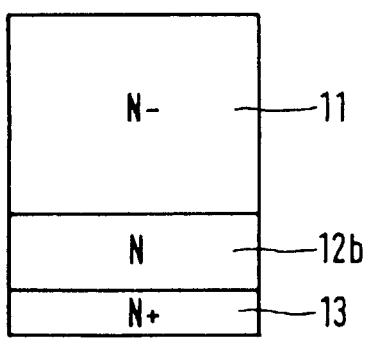
FIG. 12(a')
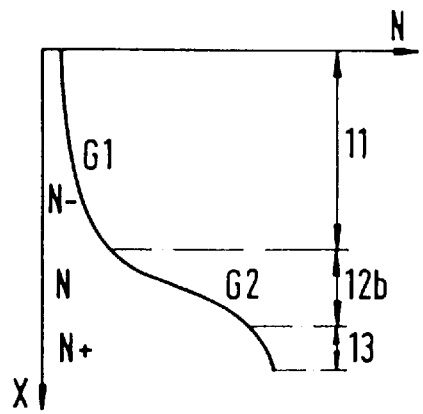
FIG. 12(b)
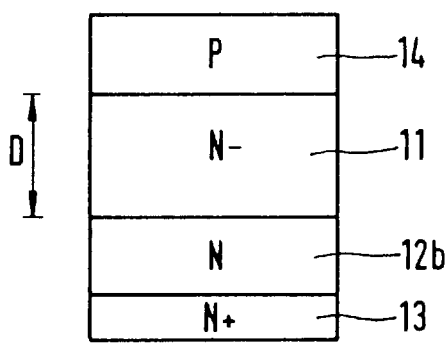
FIG. 12(b')
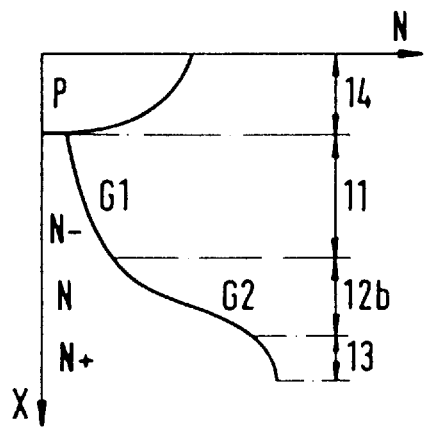
FIG. 12(c)
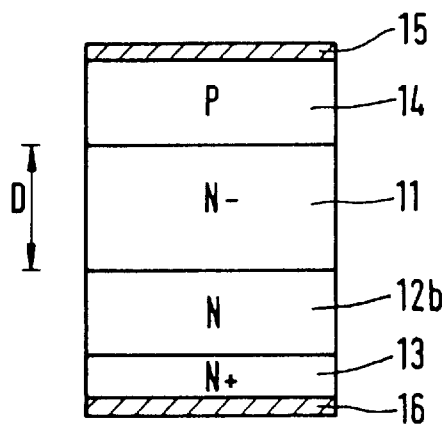

DIODE HAVING SOFT RECOVERY CHARACTERISTICS OVER A WIDE RANGE OF OPERATING CONDITIONS

BACKGROUND OF THE INVENTION

1. Field of the Invention

The present invention relates to a semiconductor diode, and particularly to improvements in characteristics of the diode, and a method of manufacturing the same.

2. Description of the Related Art

FIG. 15(a) is a sectional view showing a structure of a conventional diode 100. FIG. 15(b) is a schematic diagram showing a distribution of impurity concentration in the direction along a longitudinal section of the diode 100. This figure illustrates a relationship between the thickness X in the direction along the longitudinal section and the impurity concentration N in a semi-logarithmic scale.

The diode 100 comprises an N− layer 1 of low impurity concentration which is formed on a first main surface of an N+ layer 3 of high impurity concentration by epitaxial growth.

A P layer 4 is formed by diffusion on a first main surface of the N− layer 1 to form a PN junction J100.

An anode electrode 5 is formed on a first main surface of the P layer 4, and a cathode electrode 6 is formed adjacent to a second main surface of the N+ layer 3.

The impurity concentration of the N− layer 1 comprising a layer of low impurity concentration has a uniform distribution and substantially no gradient, as shown in FIG. 15(b).

FIG. 16(a) is a sectional view showing a structure of a conventional diode 200, and FIG. 16(b) is a schematic diagram showing a distribution of impurity concentration in the direction along a longitudinal section of the diode 200.

The diode 200 comprises an N− layer 1 of low impurity concentration, an N+ layer 3 of high impurity concentration, an N layer 2 which has an intermediate impurity concentration between the low and high impurity concentrations and which is formed between the N− and N+ layers 1 and 3, a P layer 4 formed on the upper main surface of the N− layer 1 to form a PN junction J200, an anode electrode 5 formed on the upper surface of the P layer 4, and a cathode electrode 6 formed on the lower surface of the N+ layer 3.

FIG. 17(a) is a sectional view showing a structure of a conventional diode 300, and FIG. 17(b) is a schematic diagram showing a distribution of impurity concentration in the direction along a longitudinal section of the diode 300.

The diode 300 comprises an N− layer 1' of low impurity concentration having such a concentration gradient that the impurity concentration increases from the side of the upper main surface to the side of the lower main surface, an N+ layer 3 of high impurity concentration, an N layer 2 which has an intermediate impurity concentration between the low and high impurities concentrations and which is formed between the N− and N+ layers 1' and 3, a P layer 4 formed on the upper main surface of the N− layer 1' to form a PN junction J300, an anode electrode 5 formed on the upper surface of the P layer 4, and a cathode electrode 6 formed on the lower surface of the N+ layer 3.

FIG. 14 is a schematic diagram showing an operating current waveform of a diode. After a forward current $I_F$ flows, the current decreases to zero at time t0, the current after time t0 serving as a reverse recovery current. After the time the reverse recovery current reaches a peak $I_{RM}$, there occurs a surge voltage VS which is represented by a rate of change dirr/dt (corresponding to the slope of a tangent to the reverse recovery current shown in FIG. 14) and an inductance component L of a circuit in accordance with the following equation (1):

$$VS = -L\, dirr/dt \tag{1}$$

As is obvious from the above equation (1), with a reverse recovery current waveform having a high rate of change dirr/dt (so-called hard recovery), as shown by solid line (1) in FIG. 14, the surge voltage VS is increased and sometimes fatally affects a circuit device, for example, destroys an element. When it is demanded to design a circuit device, therefore, it is required for suppressing the surge voltage that a diode has a reverse recovery current waveform having a low rate of change dirr/dt (so-called soft recovery), as shown by broken line (2) in FIG. 14.

In order to decrease a switching loss, it is also required to decrease the reverse recovery charge Qrr (corresponding to the area of the shadowed portion shown in FIG. 14) of a diode, which is calculated by time integration of the reverse recovery current.

In a diode, the PN junction J100 is formed between the P layer 4 and the N− layer 1 of low impurity concentration, as shown in FIG. 15. Since this layer 1 has a low impurity concentration, a depletion layer easily develops, and high voltage resistance can be realized.

During a reverse recovery operation of a diode having a PN-N+ structure, a depletion layer is widened into the P layer and the N− layer from the PN junction while sweeping out the excess carriers accumulated during a forward operation. Finally, the excess carriers accumulated are completely swept out. At a high rate of extension of the depletion layer, the carriers are rapidly swept out, and thus the reverse recovery current becomes zero immediately after it reaches the peak $I_{RM}$. As a result, the reverse recovery current has a hard recovery waveform having a high rate of change dirr/dt.

On the contrary, at a low rate of extension of the depletion layer, the carriers are slowly swept out, and thus the reverse recovery current hardly becomes zero after the current reaches the peak $I_{RM}$. As a result, the reverse recovery current has a soft recovery waveform having a low rate of change dirr/dt.

However, in the conventional diode 100 shown in FIG. 15, since the N− layer 1 of low impurity concentration comprises a uniform layer of low impurity concentration in order to permit easy depletion for realizing high voltage resistance, the depletion layer rapidly extends from the PN junction J100 into the N− layer 1 toward the N+ layer 3 during the reverse recovery operation. The conventional diode thus has the fault that the reverse recovery current has a hard recovery waveform, and the problem of increasing the surge voltage.

A method of solving the problem is to increase the thickness of the N− layer 1 of the diode 100. This method decreases the width ratio of the depletion layer extending due to the reverse voltage applied during the reverse recovery operation to the N− layer 1, and decreases the rate of disappearance of carriers by an amount corresponding to an increase in number of the carriers accumulated outside the depletion layer, thereby attaining the reverse recovery current having a soft recovery waveform with a low rate of change dirr/dt. However, an increase in the thickness of the N− layer 1 causes the faults of increasing the forward voltage, and increasing the reverse recovery charge Qrr, and the problem of increasing a loss.

The conventional diode 200 shown in FIG. 16 has the same structure as the diode 100 except that the N layer 2 is inserted between the N− layer 1 and N+ layer 3 of the diode 100 in order to solve the above problem. The impurity concentration of the N layer 2 is higher than the impurity concentration of the N− layer 1 so that the end of the depletion layer extending due to the reverse voltage stops at an intermediate portion in the N layer 2, and is lower than the impurity concentration of the N+ layer 3 so that excess carriers are accumulated during the forward operation. This decreases the rate of disappearance of the excess carriers accumulated in the remainder of the depletion layer of the N layer 2, which extends due to the reverse voltage applied during the reverse recovery operation, thereby obtaining a reverse recovery current having the soft recovery waveform with a low rate of change dirr/dt. In addition, since the impurity concentration of the N layer 2 is relatively high, the extension distance of the depletion layer is small, and thus soft recovery is attained even if the thickness of the N layer 2 is small. The N layer 2 need not be so thick as the N− layer 1 of the diode 100 in which the depletion layer extends at a high rate and which must be thickened. It is thus possible to restrain the total of the thickness of the N− layer 1 and the N layer 2, and the forward voltage and the reverse recovery charge Qrr are less increased.

However, an actual circuit device such as an inverter or the like is sometimes operated with various forward current densities ranging from a small current density to a large current density. Since the impurity concentration of the N layer 2 is fixed after the diode 200 is manufactured, within an operating region of very low forward current density, the density of the carriers accumulated in the N layer 2 is low, thereby eliminating the soft recovery effect. If the density of excess carriers accumulated in the N layer 2 during the forward operation is increased by decreasing the impurity concentration of the N layer 2 in order to achieve soft recovery within the operating region of very low forward current density, the rate of extension of the depletion layer in the N layer 2 is increased, thereby to eliminate the effect of attaining soft recovery.

Namely, the diode 200 has the drawback fault that soft recovery can be attained within only a specified narrow operating region of forward current density, and thus has the problem that, under some operating conditions, hard recovery is caused, and the surge voltage is consequently increased.

The conventional diode 300 shown in FIG. 17 has the same structure as the diode 200 except that an N− layer 1' having such a concentration gradient that the impurity concentration increases from the PN junction J300 toward the N layer 2 is formed in place of the N− layer 1 of the diode 200. Since, in the N− layer 1', the impurity concentration gradually increases from the junction J300 toward the N layer 2, the rate of extension of the depletion layer during the reverse recovery operation gradually decreases, thereby attaining soft recovery even within the operating region of low forward current density. Further, in an operation with a large current density, the end of the depletion layer extending due to the reverse voltage applied during the reverse recovery operation stops at an intermediate position in the N layer 2, as in the diode 200, and the rate of disappearance of the excess carriers accumulated in the remainder of the N layer 2 is decreased, thereby attaining soft recovery.

However, in an actual circuit device, the reverse voltage applied to the diode sometimes varies with variations in the power supply voltage or operation error or the like. If the reverse voltage applied during the reverse recovery operation varies, the end position of the depletion layer extending due to the reverse voltage also varies. Since the impurity concentration and thickness of the N layer 2 are fixed after the diode 300 is manufactured, therefore, if the reverse voltage is changed to a higher value, the depletion layer extending due to the reverse voltage applied during the reverse recovery operation sometimes passes through the N layer 2 and extends into the N+ layer 3. In this case, the excess carriers accumulated in the N layer 2 are also rapidly swept out by the depletion layer, thereby causing hard recovery. As a measure against this, when the impurity concentration of the N layer 2 is increased so that the depletion layer stops at an intermediate position in the N layer 2 even if the reverse voltage is increased, the density of excess carriers accumulated in the N layer 2 is conversely decreased, thereby hardly attaining soft recovery. When the thickness of the N layer 2 is increased so that the depletion layer stops at an intermediate position in the N layer 2 even if the reverse voltage is increased, the forward voltage and reverse recovery charges are significantly increased.

Namely, the diode 300 has the drawback that an increase in the reverse voltage causes hard recovery, and the problem that the surge voltage is increased by a variation in the reverse voltage due to a variation in the power supply voltage or operation error or the like. There is further the problem that if an attempt is made to solve the above problem, the forward voltage and reverse recovery charge are increased, and loss is increased.

In the conventional diodes as stated above, there are problems to be solved as follows. In the diode 100 of the above-described conventional diodes, the method of increasing the thickness of the N− layer 1 is employed. However, this method decreases the width ratio of the depletion layer extending due to the reverse voltage applied during the reverse recovery operation to the N− layer 1, and decreases the rate of disappearance of carriers by an amount corresponding to an increase in the number of the carriers accumulated outside the depletion layer. As a result, the reverse recovery current has a soft recovery waveform having a low rate of change dirr/dt. However, the conventional diode has the fault that an increase in the thickness of the N− layer 1 increases the forward voltage and the reverse recovery charge Qrr, and the problem of increasing loss.

The diode 200 has the drawback that soft recovery is attained within only a specified narrow operating region of forward current densities, and the problem that, under some operating conditions, hard recovery occurs, and the surge voltage is increased.

The diode 300 has the drawback that an increase in the reverse voltage causes hard recovery, and the problem that the surge voltage is increased by a variation in the reverse voltage due to a variation in the power supply voltage or operation error or the like. There is also the problem that an attempt to solve the above problem increases the forward voltage and the reverse recovery charge, and increases loss.

SUMMARY OF THE INVENTION

The present invention has been achieved for solving the above problems, and an object of the present invention is to provide a diode in which the surge voltage is decreased by attaining soft recovery, in which loss is decreased by suppressing reverse recovery charge, in which soft recovery is maintained under operating conditions of various forward current densities, and the surge voltage is decreased, in which soft recovery is maintained even if the reverse voltage changes, and the surge voltage is decreased, and methods of manufacturing diodes having these characteristics.

To achieve the foregoing and other objectives, and in accordance with the purpose of the present invention, a diode is provided which comprises a first semiconductor layer of a first conductivity type having such an impurity concentration gradient that the impurity concentration increases from a first main surface thereof toward a second main surface thereof opposite to the first main surface; a second semiconductor layer of the first conductivity type having a first main surface adjacent to the second main surface of the first semiconductor layer and such an impurity concentration gradient that the impurity concentration increases from the first main surface thereof toward a second main surface thereof opposite to the first main surface; a third semiconductor layer of the first conductivity type having a first main surface adjacent to the second main surface of the second semiconductor layer and an impurity concentration higher than the impurity concentration of the second main surface of the second semiconductor layer; a fourth semiconductor layer of the second conductivity type formed adjacent to the first main surface of the first semiconductor layer; a first main electrode provided adjacent to the fourth semiconductor layer; and a second main electrode provided adjacent to the second main surface opposite to the first main surface of the third semiconductor layer; wherein the impurity concentration of the second main surface of the first semiconductor layer is equal to the impurity concentration of the first main surface of the second semiconductor layer, and the impurity concentration gradient of the first semiconductor layer is greater than, or equal to the impurity concentration gradient of the second semiconductor layer.

Another object of the invention is to provide a diode in which the thickness of the first semiconductor layer is greater than or equal the distance a depletion layer extends due to a reverse voltage in the diode above stated.

A further object of the invention is to provide a diode which comprises a first semiconductor layer of a first conductivity type having such an impurity concentration gradient that the impurity concentration increases from a first main surface thereof toward a second main surface thereof opposite to the first main surface; a second semiconductor layer of the first conductivity type having a first main surface formed adjacent to the second main surface of the first semiconductor layer, and such an impurity concentration gradient that the impurity concentration increases from the first main surface thereof to a second main surface thereof opposite to the first main surface; a third semiconductor layer of the first conductivity type having a first main surface formed adjacent to the second main surface of the second semiconductor layer and an impurity concentration higher than the impurity concentration of the second main surface of the second semiconductor layer; a fourth semiconductor layer of a second conductivity type formed adjacent to the first main surface of the first semiconductor layer; a first main electrode provided adjacent to the fourth semiconductor layer; and a second main electrode provided adjacent to the second main surface of the third semiconductor layer opposite to the first main surface thereof; wherein the impurity concentration of the second main surface of the first semiconductor layer is equal to the impurity concentration of the first main surface of the second semiconductor layer, and the impurity concentration gradient of the first semiconductor layer is smaller than the impurity concentration gradient of the second semiconductor layer.

A further object of the invention is to provide a diode, in which the thickness of the first semiconductor layer is greater than, or equal to the distance a depletion layer extends due to a reverse voltage in the above stated diode.

A further object of the invention is to provide a diode which comprises a first semiconductor layer of a first conductivity type having a constant impurity concentration within the region from a first main surface thereof to a second main surface thereof opposite to the first main surface; a second semiconductor layer of the first conductivity type having a first main surface formed adjacent to the second main surface of the first semiconductor layer, and such an impurity concentration gradient that the impurity concentration increases from the first main surface thereof having an impurity concentration equal to the impurity concentration of the first semiconductor layer to a second main surface thereof opposite to the first main surface; a third semiconductor layer of the first conductivity type having a first main surface formed adjacent to the second main surface of the second semiconductor layer and an impurity concentration higher than the impurity concentration of the second main surface of the second semiconductor layer; a fourth semiconductor layer of a second conductivity type formed adjacent to the first main surface of the first semiconductor layer; a first main electrode provided adjacent to the fourth semiconductor layer; and a second main electrode provided adjacent to the second main surface opposite to the first main surface of the third semiconductor layer; wherein the thickness of the first semiconductor layer is smaller than, or equal to the width of a depletion layer at the time a reverse recovery current reaches a peak.

A further object of the invention is to provide a method of manufacturing a diode which comprises the steps of preparing a semiconductor substrate of a first conductivity type; forming a first epitaxial layer by growing a plurality of epitaxial layers of said first conductivity type such that an impurity concentration at a first main surface thereof adjacent to a second main surface of said semiconductor substrate smaller than or equal to that of said semiconductor substrate, and the impurity concentration gradually decreases from the first main surface thereof to a second main surface opposite said first main surface; forming a second epitaxial layer by growing a plurality of epitaxial layers of said first conductivity type so that an impurity concentration of a first main surface thereof adjacent to said second main surface of said first epitaxial layer is equal to that of said second main surface of said first epitaxial layer, and the impurity concentration gradually decreases from the first main surface thereof to a second main surface opposite said first main surface; forming a semiconductor layer of a second conductivity type adjacent to said second main surface of said second epitaxial layer; providing a first main electrode adjacent to said semiconductor layer; and providing a second main electrode adjacent to said first main surface of said semiconductor substrate.

A further object of the invention is to provide a method of manufacturing a diode which comprises the steps of preparing a semiconductor substrate of a first conductivity type; forming a first epitaxial layer by growing a plurality of epitaxial layers of said first conductivity type so that an impurity concentration of a first main surface thereof adjacent to a second main surface of said semiconductor substrate is smaller than or equal to that of said semiconductor substrate, and the impurity concentration gradually decreases from the first main surface thereof to a second main surface opposite said first main surface; forming a second epitaxial layer by growing a single epitaxial layer of said first conductivity type so that an impurity concentration at a first main surface thereof adjacent to said second main surface of said first epitaxial layer is equal to that at said second main surface of said first epitaxial layer, and the impurity concentration is constant from the first main surface thereof to a second main surface opposite said first main surface; forming a semiconductor layer of a second conductivity type adjacent to said second main surface of said second epitaxial layer; providing a first main electrode adjacent to said third semiconductor; and providing a second main electrode adjacent to said first main surface of said semiconductor substrate.

A further object of the invention is to provide a method of manufacturing a diode which comprises the steps of forming a first layer of a first conductivity type by ion implantation or impurity diffusion from the side of a first main surface of a first semiconductor substrate so that said first layer has an impurity concentration gradient such that an impurity concentration thereof decreases from a first main surface thereof to second main surface opposite said first main surface thereof such that the impurity concentration of each of said first and second main surfaces is a predetermined value; forming a second layer of said first conductivity type by ion implantation or impurity diffusion from the side of a first main surface of second semiconductor substrate such that said second layer has an impurity concentration gradient wherein the impurity concentration thereof decreases from a first main surface thereof to a second main surface thereof opposite said first main surface such that the impurity concentration of each of said first and second main surfaces is a predetermined value; forming a third layer of said first conductivity type having an impurity concentration higher than or equal to that at said first main surface of said second layer; laminating said first main surface of said second layer to a first main surface of said third layer; laminating said first main surface of said first layer to said second main surface of said second layer;
forming a fourth layer of a second conductivity type adjacent to said second main surface of said first layer by ion implantation or impurity diffusion from said second main surface of said first layer; providing a first main electrode adjacent to said fourth layer; and providing a second main electrode adjacent to a second main surface of said third layer.

A further object of the invention is to provide a method of manufacturing a diode which comprises the steps of forming a first layer of a first conductivity type having an impurity concentration which is constant from a first main surface thereof to a second main surface thereof opposite said first main surface; forming a second layer of said first conductivity type by ion implantation or impurity diffusion from the side of a first main surface of a substrate so that said second layer has an impurity concentration gradient such that an impurity concentration thereof decreases from a first main surface thereof to a second main surface opposite said first main surface such that the impurity concentration of each of said first and second main surfaces is a predetermined value; forming a third layer of said first conductivity type having an impurity concentration higher than or equal to that at said first main surface of said second layer; laminating said first main surface of said second layer to a first main surface of said third layer; laminating said first main surface of said first layer to said second main surface of said second layer; forming a fourth layer of a second conductivity type adjacent to said second main surface of said first layer by ion implantation or impurity diffusion from said second main surface of said first layer; providing a first main electrode adjacent to said fourth layer; and providing a second main electrode adjacent to a second main surface of said third layer.

A further object of the invention is to provide a method of manufacturing a diode which comprises the steps of forming a first layer of a first conductivity type by ion implantation or impurity diffusion from the side of a first main surface of a substrate so that said first layer has an impurity concentration gradient such that the impurity concentration thereof decreases from said first main surface thereof to a second main surface opposite said first main surface such that the impurity concentration of each of said first and second main surfaces is a predetermined value; forming a second layer of said first conductivity type having an impurity concentration higher than or equal to that at said first main surface of said first layer; laminating said first main surface of said first layer to a second main surface of said second layer; forming a third layer by growing a single epitaxial layer of said first conductivity type so that an impurity concentration at a first main surface thereof is equal to that of said second main surface of said first layer adjacent thereto, and the impurity concentration is constant from said first main surface thereof to a second main surface opposite said first main surface; forming a fourth layer of a second conductivity type adjacent to said second main surface of said third layer by ion implantation or impurity diffusion from said second main surface of said third layer; providing a first main electrode adjacent to said fourth layer; and providing a second main electrode adjacent to a first main surface of said second layer.

A further object of the invention is to provide a method of manufacturing a diode which comprises the steps of forming a first layer of a first conductivity type having an impurity concentration which is constant from a first main surface thereof to a second main surface thereof opposite said first main surface; forming a second layer of said first conductivity type by ion implantation or impurity diffusion from a side of said second main surface of said first layer so that a first main surface of said second layer is formed adjacent to said second main surface of said first layer, said second layer having an impurity concentration gradient such that an impurity concentration thereof increases from said first main surface thereof to a second main surface opposite said first main surface, wherein said second main surface thereof has a predetermined impurity concentration; forming a third layer by growing an epitaxial layer of said first conductivity type so that a first main surface thereof is formed adjacent to said second main surface of said second layer so as to have an impurity concentration greater than or equal to that at said second main surface of said second layer, and said third layer has an impurity concentration which is constant from said first main surface thereof to a second main surface thereof opposite said first main surface; forming a fourth layer of a second conductivity type adjacent to said first main surface of said first layer by ion implantation or impurity diffusion from said first main surface of said first layer; providing a first main electrode adjacent to said fourth layer; and providing a second main electrode adjacent to said second main surface of said third layer.

A further object of the invention is to provide a method of manufacturing a diode which comprises the steps of forming a first layer of a first conductivity type by ion implantation or impurity diffusion from a side of a first main surface of a first semiconductor substrate so that said first layer has an impurity concentration gradient such that an impurity concentration thereof decreases from a first main surface thereof to a second main surface thereof opposite said first main surface, and the impurity concentration of each of said first and second main surfaces is a predetermined value; forming a second layer of said first conductivity type by ion implantation or impurity diffusion from said first main surface of said first layer so that a first main surface thereof is formed adjacent to said first main surface of said first layer, and said second layer has an impurity concentration gradient such that an impurity concentration thereof increases from said first main surface thereof to a second main surface opposite said first main surface to form said second layer and a third layer;

forming a fourth layer of a second conductivity type adjacent to said second main surface of said first layer by ion implantation or impurity diffusion from a side of said second main surface of said first layer; providing a first main electrode adjacent to said fourth layer; and providing a second main electrode adjacent to a second main surface of said third layer.

Other and further objects, features and advantages of the invention will appear more fully from the following description.

BRIEF DRAWING OF THE DRAWINGS

FIG. 5(a) is a sectional view showing a structure of a diode in accordance with a fifth embodiment of the present invention, and FIG. 5(b) is a schematic drawing showing a distribution of impurity concentration in the direction along a longitudinal section of the diode.

FIGS. 6(a) to (d) are sectional views showing a process of manufacturing a diode in accordance with a sixth embodiment of the present invention, and FIGS. 6(a') to (c') are schematic drawings respectively showing distributions of impurity concentration in the direction along a longitudinal section.

FIGS. 7(a) to (d) are sectional views showing a process of manufacturing a diode in accordance with a seventh embodiment of the present invention, and FIGS. 7(a') to (c') are schematic drawings respectively showing distributions of impurity concentration in the direction along a longitudinal section.

FIGS. 8(a) to (h) are sectional views showing a process of manufacturing a diode in accordance with an eighth embodiment of the present invention, and FIGS. 8(a') to (g') are schematic drawings respectively showing distributions of impurity concentration in the direction along a longitudinal section.

FIGS. 9(a) to (f) are sectional views showing a process of manufacturing a diode in accordance with a ninth embodiment of the present invention, and FIGS. 9(a') to (e') are schematic drawings respectively showing distributions of impurity concentration in the direction along a longitudinal section.

FIGS. 10(a) to (c) are sectional views showing a process of manufacturing a diode in accordance with a tenth embodiment of the present invention, and FIGS. 10(a') and (b') are schematic drawings respectively showing distributions of impurity concentration in the direction along a longitudinal section.

FIGS. 11(a) to (e) are sectional views showing a process of manufacturing a diode in accordance with an eleventh embodiment of the present invention, and FIGS. 11(a') to (d') are schematic drawings showing respectively distributions of impurity concentration in the direction along a longitudinal section.

FIGS. 12(a) to (c) are sectional views showing a process of manufacturing a diode in accordance with a twelfth embodiment of the present invention, and FIGS. 12(a') and (b') are schematic drawings respectively showing distributions of impurity concentration in the direction along a longitudinal section.

Figure 13:
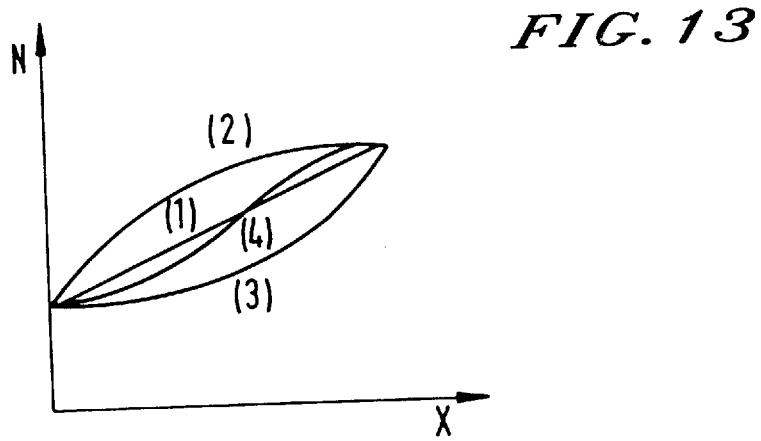

FIG. 13 is a schematic drawing showing a distribution of impurity concentration in the direction along a longitudinal section of an N– or N layer of a diode in accordance with the first to twelfth embodiments of the present invention.

Figure 14:
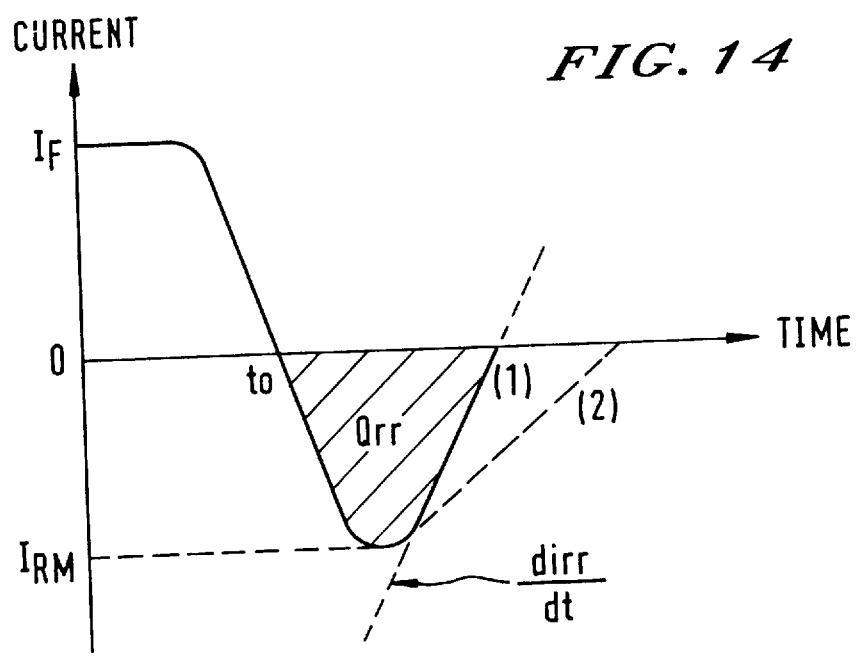

FIG. 14 is a schematic drawing showing an operating current waveform of a diode.

Figure 15A:
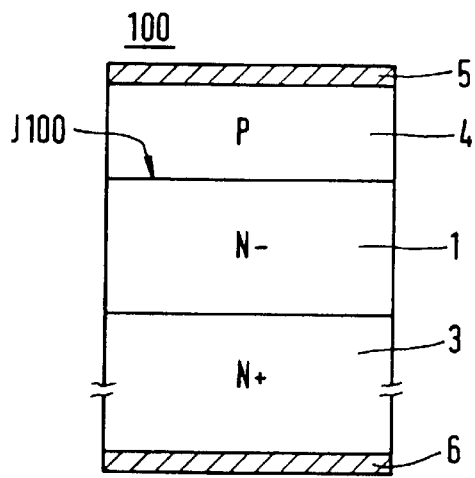
Figure 15B:
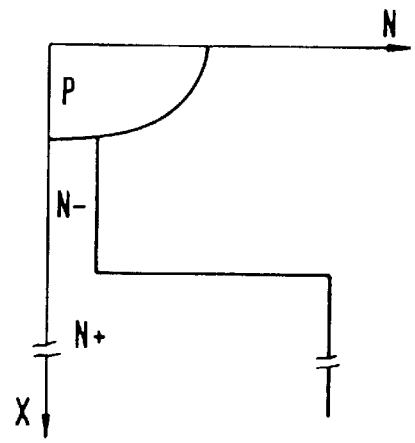

FIG. 15(a) is a sectional view showing a structure of an example of conventional diodes, and FIG. 15(b) is a schematic drawing showing a distribution of impurity concentration in the direction along a longitudinal section of the diode.

Figure 16A:
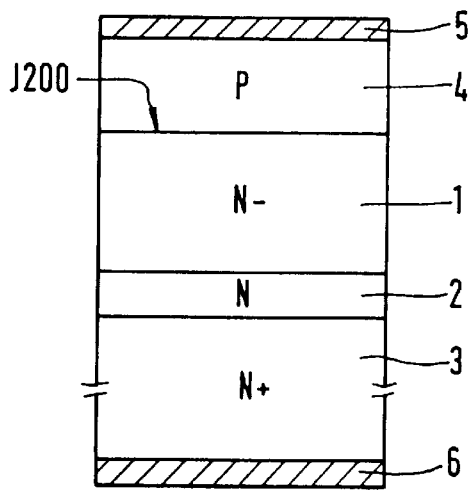
Figure 16B:
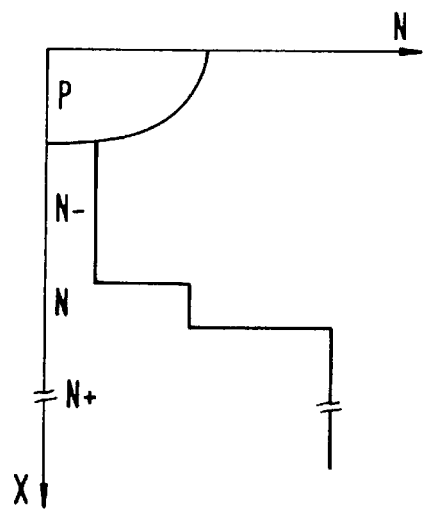

FIG. 16(a) is a sectional view showing a structure of another example of conventional diodes, and FIG. 16(b) is a schematic drawing showing a distribution of impurity concentration in the direction along a longitudinal section of the diode.

Figure 17A:
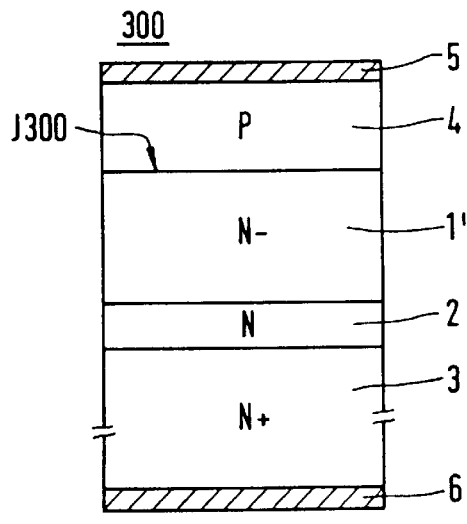
Figure 17B:
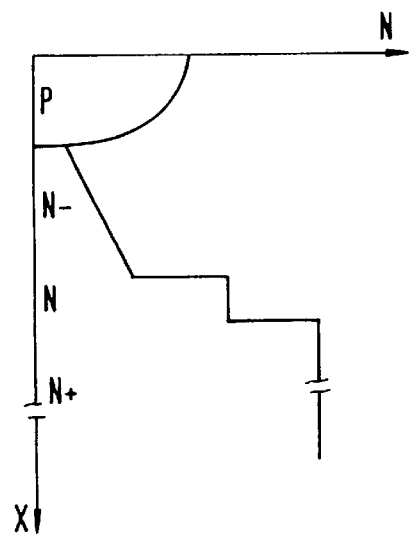

FIG. 17(a) is a sectional view showing a structure of a further example of conventional diodes, and FIG. 17(b) is a schematic drawing showing a distribution of impurity concentration in the direction along a longitudinal section of the diode.

DETAILED DESCRIPTION OF THE PREFERRED EMBODIMENTS

Figure 1A:
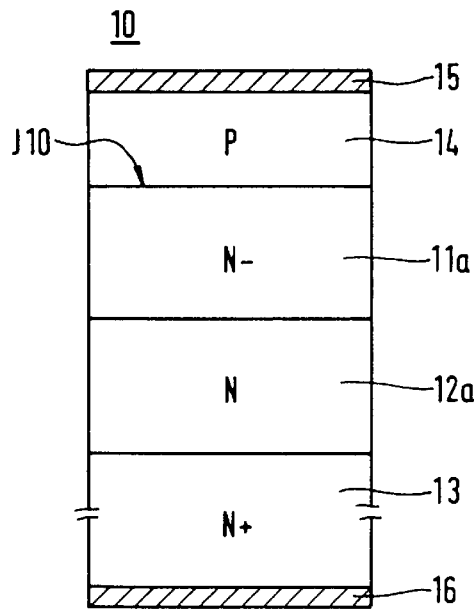
FIG. 1(a) is a sectional view showing a structure of a diode in accordance with a first embodiment of the present invention.
Figure 1B:
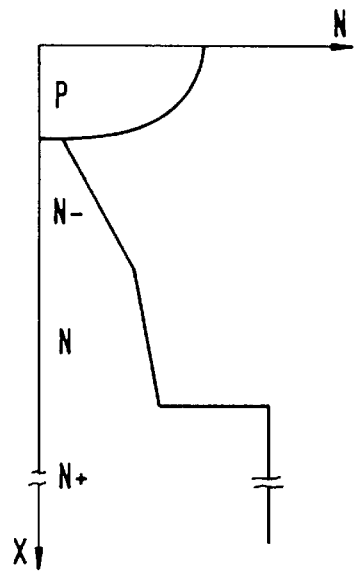
FIG. 1(b) is a schematic drawing showing a distribution of impurity concentration in the direction along a longitudinal section of the diode.

The first embodiment of this invention will be shown with reference to the drawings. FIG. 1(a) is a sectional view showing a structure of a diode 10 in accordance with a first embodiment of the present invention, and FIG. 1(b) is a schematic diagram showing a distribution of impurity concentration in the direction along a longitudinal section of the diode 10. FIG. 1(b) shows a relation between the thickness X in the direction along the longitudinal section and the impurity concentration N in a semi-logarithmic scale.

The diode 10 shown in FIG. 1 can be manufactured as described below.

An N+ semiconductor substrate is first prepared as an N+ layer 13. An N-type epitaxial layer is then grown on a first main surface of the N+ layer 13 by controlling doping so that the impurity concentration gradually decreases to form an N layer 12a having an impurity concentration gradient. An N-type epitaxial layer is successively grown on a first main surface of the N layer 12a by controlling doping so that the impurity concentration gradually decreases to form an N– layer 11a having an impurity concentration gradient which is greater than, or equal to, that of the N layer 12a.

A P layer 14 is then formed by ion implantation or diffusion of P-type impurities from the side of the first main surface of the N– layer 11a to form a PN junction J10. A first electrode 15 comprising an anode electrode and a second electrode 16 comprising a cathode electrode are formed, by metal deposition, on a first main surface of the P layer 14 and a second main surface of the N+ layer 13, respectively, to obtain a structure of the diode 10.

In the diode 10, since the N– layer 11a has such an impurity concentration gradient that the impurity concentration gradually increases from the PN junction J10 to the N layer 12a, the impurity concentration at the end of a depletion layer gradually increases as the depletion layer extends in the N– layer 11a with the passage of time during a reverse recovery operation. Thus, the rate of extension of the depletion layer gradually decreases, and the reverse recovery current hardly becomes zero after it reaches the peak IRM, thereby achieving soft recovery. Consequently, occurrence of a surge voltage is suppressed.

Under the operating condition of a low forward current density, excess carriers are accumulated in almost only the N– layer 11a during the forward operation, and are hardly accumulated in the N layer 12a and N+ layer 13. Even in this case, since the rate of extension of the depletion layer in the N– layer 11a during the reverse recovery operation gradually decreases, soft recovery is maintained. As a result, occurrence of the surge voltage is suppressed even under the operating condition of a low forward current density.

Since the N layer 12a has such an impurity concentration gradient that the concentration gradually increases from the side of the first main surface thereof to the side of the second main surface thereof, the rate of extension of the depletion layer, which extends in the N layer 12a during the reverse recovery operation, gradually decreases due to the concentration gradient, thereby achieving a higher level of soft recovery. As a result, occurrence of the surge voltage is further suppressed.

Since the impurity concentration gradient of the N layer 12a is smaller than, or equal to, that of the N– layer 11a, the width of a region of the N layer 12a, which has a low impurity concentration, is substantially large, and a large number of excess carriers are accumulated in the N layer 12a during the forward operation. A large number of excess carriers thus remain at the time the reverse recovery current reaches the peak, and take much time to disappear. Therefore, the reverse recovery current slowly becomes zero after it reaches the peak, thereby achieving soft recovery. As a result, occurrence of the surge voltage is further suppressed.

Moreover, even if the distance of extension of the depletion layer is increased by a variation in the reverse voltage during the reverse recovery operation, the depletion layer extending due to the reverse voltage does not reach the N+ layer 13 and stops at an intermediate position in the N layer 12a because the impurity concentration of the N layer 12a gradually increases. The excess carriers accumulated in a remainder of the N layer 12a where the depletion layer does not reach, slowly disappear, thereby achieving soft recovery. In this case, since the rate of extension of the depletion layer gradually decreases due to the concentration gradient of the N layer 12a, a higher level of soft recovery is attained. Further, since the impurity concentration of the N layer 12a gradually changes, soft recovery is achieved at various values of reverse voltages within a range below the voltage resistance value, not a specified voltage value. Consequently, occurrence of the surge voltage is suppressed.

Figure 2A:
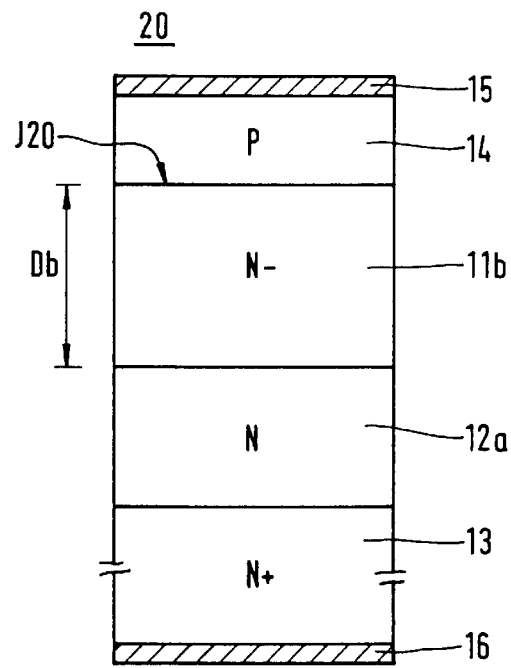
FIG. 2(a) is a sectional view showing a structure of a diode in accordance with a second embodiment of the present invention.
Figure 2B:
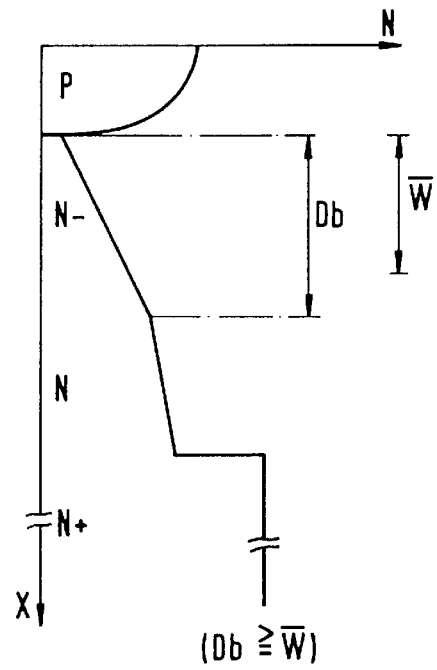
FIG. 2(b) is a schematic drawing showing a distribution of impurity concentration in the direction along a longitudinal section of the diode.

The second embodiment of this invention will be shown with reference to the drawings. FIG. 2(a) is a sectional view showing a structure of a diode 20 in accordance with a second embodiment of the present invention, and FIG. 2(b) is a schematic diagram showing a distribution of impurity concentration in the direction along a longitudinal section of the diode 20.

The diode 20 shown in FIG. 2 can be manufactured as described below.

An N+ semiconductor substrate is first prepared as an N+ layer 13, and An N-type epitaxial layer is grown on the first main surface of the N+ layer 13 by controlling doping so that the impurity concentration gradually decreases to form an N layer 12a having an impurity concentration gradient. An N-type epitaxial layer is successively grown on the first main surface of the N layer 12a by controlling doping so that the impurity concentration gradually decreases to form an N– layer 11b which has an impurity concentration gradient greater than, or equal to that of the N layer 12a and a thickness Db greater than, or equal to, the distance W a depletion layer extends due to the reverse voltage.

The distance W the depletion layer extends due to the reverse voltage can be calculated by simulation or the like.

A P layer 14 is then formed by ion implantation or diffusion of P-type impurities from the side of the first main surface of the N– layer 11b to form a PN junction J20. Anode electrode 15 and a cathode electrode 16 are formed on the first main surface of the P layer 14 and the second main surface of the N+ layer 13, respectively, by metal deposition, to obtain a structure of the diode 20. Like the diode 10, this diode 20 has the function to achieve soft recovery even under operating conditions where the forward current density is low and where the reverse voltage changes. Consequently, occurrence of a surge voltage is suppressed.

In addition, since the thickness Db of the N– layer 11b is greater than, or equal to, the distance W the depletion layer extends due to the reverse voltage, the number of the excess carriers accumulated during the forward operations in a remainder of the N– layer 11b and the N layer 12a where the depletion layer extending due to the reverse voltage applied during the reverse recovery operation does not reach, is increased, and the excess carriers thus take much time to disappear, thereby achieving a higher level of soft recovery. Consequently, occurrence of the surge voltage is further suppressed.

Figure 3A:
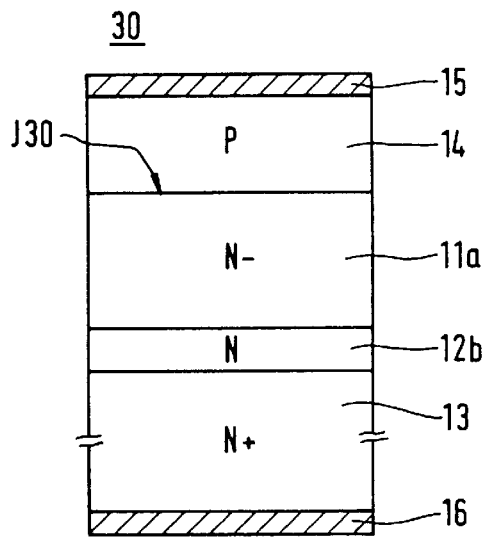
FIG. 3(a) is a sectional view showing a structure of a diode in accordance with a third embodiment of the present invention.
Figure 3B:
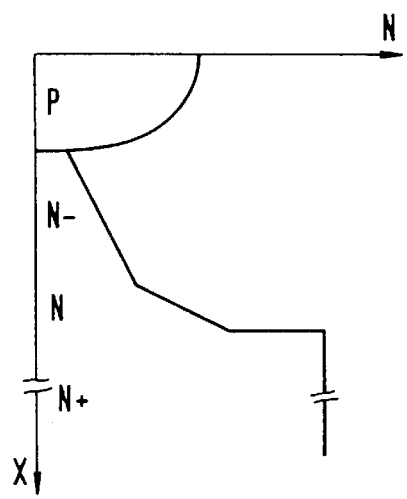
FIG. 3(b) is a schematic drawing showing a distribution of impurity concentration in the direction along a longitudinal section of the diode.

The third embodiment of this invention will be shown with reference to the drawings. FIG. 3(a) is a sectional view showing a structure of a diode 30 in accordance with a third embodiment of the present invention, and FIG. 3(b) is a schematic diagram showing a distribution of impurity concentration in the direction along a longitudinal section of the diode 30.

The diode 30 shown in FIG. 3 can be manufactured as described below.

An N+ semiconductor substrate is first prepared as an N+ layer 13, and an N-type epitaxial layer is grown on the first main surface of the N+ layer 13 by controlling doping so that the impurity concentration gradually decreases to form an N layer 12b having an impurity concentration gradient. An N-type epitaxial layer is successively grown on the first main surface of the N layer 12b by controlling doping so that the impurity concentration gradually decreases to form an N– layer 11a having an impurity concentration gradient which is smaller than the concentration gradient of the N layer 12b. A P layer 14 is then formed by ion implantation or diffusion of P-type impurities from the side of the first main surface of the N– layer 11a to form a PN junction J30.

An anode electrode 15 and a cathode electrode 16 are formed on the first main surface of the P layer 14 and the second main surface of the N+ layer 13, respectively, by metal deposition to obtain a structure of the diode 30.

In the diode 30, since the N– layer 11a has such an impurity concentration gradient that the concentration gradually increases from the PN junction J30 to the N layer 12b, the rate of extension of a depletion layer gradually decreases as the depletion layer extends in the N– layer 11a during the reverse recovery operation, thereby achieving soft recovery, as in the diode 10. As a result, occurrence of the surge voltage is suppressed.

Under the operating coition of a low forward current density, excess carriers are accumulated almost only in the N– layer 11a during the forward operation, and are hardly accumulated in the N layer 12b and the N+ layer 13. However, even in this case, since the rate of extension of the depletion layer in the N– layer 11a during the reverse recovery operation gradually decreases, soft recovery is maintained. As a result, occurrence of the surge voltage is suppressed under the operating condition of a low forward current density.

Moreover, since the N layer 12b has such an impurity concentration gradient that the impurity concentration gradually increases from the side of the first main surface thereof to the side of the second main surface thereof, as in the diode 10, the rate of extension of the depletion layer extending in the N layer 12b during the reverse recovery operation gradually decreases due to the concentration gradient, thereby achieving a higher level of soft recovery. As a result, occurrence of the surge voltage is further suppressed.

In addition, even if the extension distance of the depletion layer is increased by a variation in the reverse voltage during the reverse recovery operation, the depletion layer extending due to the reverse voltage does not reach the N+ layer 13 and stops at an intermediate position in the N layer 12b because the impurity concentration of the N layer 12b gradually increases. Thus, the excess carriers accumulated in a remainder of the N layer 12b where the depletion layer does not reach, slowly disappear, thereby achieving soft recovery.

Further, in this case, since the rate of extension of the depletion layer gradually decreases due to the concentration gradient of the N layer 12b, a higher level of soft recovery is attained. Since the impurity concentration of the N layer 12b gradually changes, soft recovery is attained at various values of reverse voltages within a range below the voltage resistance value, not at a specified voltage value. As a result, occurrence of the surge voltage is suppressed.

Further, since the impurity concentration gradient of the N layer 12b is greater than that of the N– layer 11a, the width of a region of the N layer 12b, which has a low impurity concentration, is substantially small, and the number of the excess carriers accumulated in the N layer 12b during the forward operation is decreased, thereby decreasing the reverse recovery charge Qrr. Consequently, a low loss is achieved.

Figure 4A:
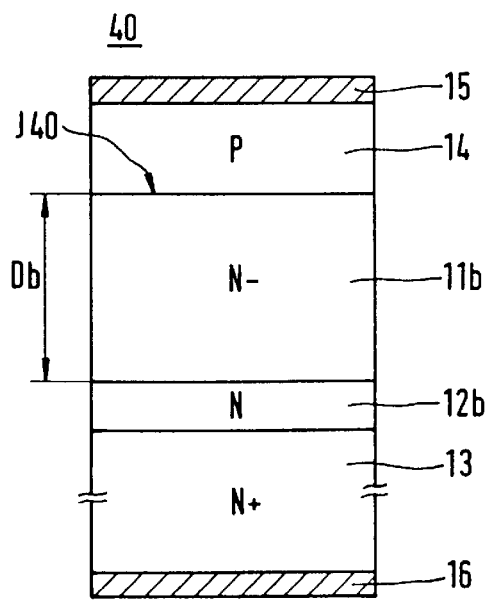
FIG. 4(a) is a sectional view showing a structure of a diode in accordance with a fourth embodiment of the present invention.
Figure 4B:
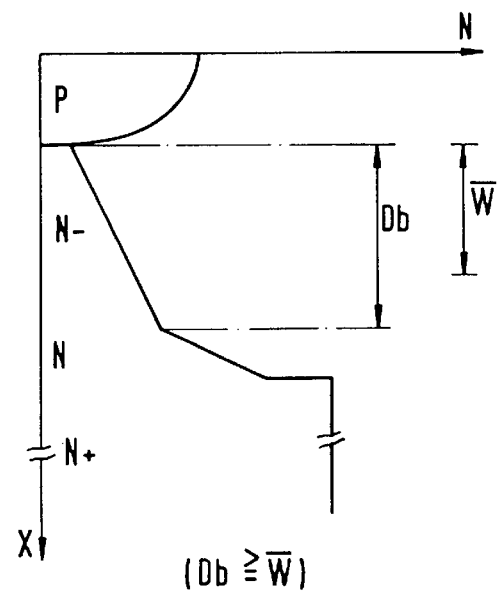
FIG. 4(b) is a schematic drawing showing a distribution of impurity concentration in the direction along a longitudinal section of the diode.

The fourth embodiment of this invention will be shown with reference to the drawings. FIG. 4(a) is a sectional view showing a structure of a diode 40 in accidence with a fourth embodiment of the present invention, and FIG. 4(b) is a schematic drawing showing a distribution of impurity concentration in the direction along a longitudinal section of the diode 40.

The diode 40 shown in FIG. 4 can be manufactured as described below.

An N+ semiconductor substrate is first prepared as an N+ layer 13, and an N-type epitaxial layer is grown on the first main surface of the N+ layer 13 by controlling doping so that the impurity concentration gradually decreases to form an N layer 12b having an impurity concentration gradient. An N-type epitaxial layer is successively grown on the first main surface of the N layer 12b by controlling doping so that the impurity concentration gradually decreases to form an N– layer 11b having an impurity concentration gradient smaller than the concentration gradient of the N layer 12b and a thickness Db greater than, or equal to, the distance W a depletion layer extends due to the reverse voltage.

The distance W the depletion layer extends due to the reverse voltage can be calculated by simulation or the like.

A P layer 14 is then formed by ion implantation or diffusion of P-type impurities from the side of the first main surface of the N– layer 11b to form a PN junction J40. An anode electrode 15 and a cathode electrode 16 are formed on the first main surface of the P layer 14 and the second main surface of the N+ layer 13, respectively, by metal deposition to obtain a structure of the diode 40.

Like the diode 30, this diode 40 has the function to achieve soft recovery even under operating conditions where the forward current density is low and where the reverse voltage changes, and thus occurrence of the surge voltage is suppressed. At the same time, the reverse recovery charge is decreased, and loss is decreased.

Further, since the thickness of the N– layer 11b is greater than, or equal to the distance W the depletion layer extends due to the reverse voltage, the number of the excess carriers accumulated, during the forward operation, in a remainder of the N– layer 11b and the N layer 12b where the depletion layer extending due to the reverse voltage applied during the reverse recovery operation does not reach, is increased, and thus the excess carriers take much time to disappear, thereby achieving a higher level of soft recovery. As a result, occurrence of the surge voltage is further suppressed.

The fifth embodiment of this invention will be shown with reference to the drawings. FIG. 5(a) is a sectional view showing a structure of a diode 50 in accordance with a fifth embodiment of the present invention, and FIG. 5(b) is a schematic drawing showing a distribution of impurity concentrations in the direction along the longitudinal section of the diode 50.

The diode 50 shown in FIG. 5 can be manufactured as described below.

An N+ semiconductor substrate is first prepared as an N+ layer 13, and an N-type epitaxial layer is grown on the first main surface of the N+ layer 13 by controlling doping so that the impurity concentration gradually decreases to form an N layer 12c having an impurity concentration gradient. An N-type epitaxial layer is uniformly grown on the first main surface of the N layer 12c so as to have a low impurity concentration to form an N– layer 11c having a thickness Dc smaller than, or equal to, the width $W_{IRM}$ of a depletion layer at the time a reverse recovery current reaches a peak.

The width $W_{IRM}$ of the depletion layer at the time the reverse recovery current reaches the peak can be calculated by simulation or the like.

A P layer 14 is formed by ion implantation or diffusion of P-type impurities from the side of the first main surface of the N– layer 11c to form a PN junction J50. An anode electrode 15 and a cathode electrode 16 are then formed by metal deposition on the first main surface of the P layer 14 and the second main surface of the N+ layer 13, respectively, to obtain a structure of the diode 50.

This diode 50 has a structure in which the impurity concentration of the N– layer 11a of the diode 10 or diode 30 is uniformed. At a low impurity concentration, even if the thickness of the N– layer 11c is decreased, therefore, voltage resistance can be maintained, and the number of the excess carriers accumulated during the forward operation can be decreased by an amount corresponding to a decrease in the thickness, thereby decreasing the reverse recovery charge. As a result, loss is decreased.

Moreover, since the thickness Dc of the N– layer 11c is smaller than, or equal to, the width $W_{IRM}$ of the depletion layer at the time the reverse recovery current reaches the peak, the rate of extension of the depletion layer gradually decreases because the end of the depletion layer extends into the N layer 12c having an impurity concentration gradient after the reverse recovery current reaches the peak, thereby achieving soft recovery. As a result, occurrence of the surge voltage is suppressed.

In addition, since the excess carriers accumulated, during the forward operation, in the remainder of the N layer 12c where the depletion layer extending due to the reverse voltage applied during the reverse recovery operation does not reach, slowly disappear, a higher level of soft recovery is achieved. Consequently, occurrence of the surge voltage is further suppressed.

Further, even if the distance of extension of the depletion layer is increased by a variation in the reverse voltage during the reverse recovery operation, the depletion layer 13 extending due to the reverse voltage does not reach the N+ layer and stops at an intermediate position in the N layer 12c because the impurity concentration of the N layer 12c gradually increases. Thus, the excess carriers accumulated in the remainder of the N layer 12c where the depletion layer does not reach, slowly disappear, thereby achieving soft recovery.

Moreover, in this case, since the rate of extension of the depletion layer gradually decreases due to the concentration gradient of the N layer 12c, a higher level of soft recovery is attained. In addition, since the impurity concentration of the N layer 12c gradually changes, soft recovery is achieved at various values of reverse voltages within a region below the maximum tolerable voltage, not at a specified voltage value. As a result, occurrence of the surge voltage is suppressed.

The first embodiment of the manufacturing method for manufacturing the diodes 10, 20, 30 and 40 in accordance with the present invention will be described with reference to FIG. 6. FIGS. 6(a'), (b') and (c') are schematic drawings showing distributions of impurity concentrations in the direction along the longitudinal sections shown in FIGS. 6(a), (b) and (c), respectively.

As shown in FIG. 6(a), an N+ semiconductor substrate is prepared as the N+ layer 13, and a plurality of N-type epitaxial layers are grown on the first main surface of the N+ layer 13 so that the impurity concentration gradually decreases to form a semiconductor region which is approximately considered as having an impurity concentration which gradually decreases from the side of the second main surface to the side of the first main surface thereof, i.e., an impurity concentration gradient G2, as shown in FIG. 6(a'). Thus-formed semiconductor region forms the N layer 12.

As shown in FIG. 6(b), a plurality of N-type epitaxial layers are further grown on the first main surface of the N layer 12 so that the impurity concentration gradually decreases to form a semiconductor layer which is approximately considered as having an impurity concentration which gradually decreases from the side of the second main surface to the side of the first main surface thereof, i.e., an impurity concentration gradient G1, as shown in FIG. 6(b'). The thus-formed semiconductor layer forms the N– layer 11. The P layer 14 is formed by ion implantation or diffusion of P-type impurities from the side of the first main surface of the N– layer 11, as shown in FIG. 6(c). The anode electrode 15 and the cathode electrode 16 are then formed, by metal deposition, on the first main surface of the P layer 14 and the second main surface of the N+ layer 13, respectively, as shown in FIG. 6(d).

If the thickness of the N– layer 11 is D, and the distance the depletion layer extends in the N– layer 11 due to the reverse voltage applied to each of the diodes during the reverse recovery operation is W, the diodes 10, 20, 30 and 40 respectively have the following relations between the impurity concentration gradient G1 of the N– layer 11 and the impurity concentration gradient G2 of the N layer 12.

(1) If the N– layer 11 and the N layer 12 are formed so as to have the relation G1≧G2, the diode 10 is obtained.

(2) If the N– layer 11 and the N layer 12 are formed so as to have the relations G1≧G2 and D≧W, the diode 20 is obtained.

(3) If the N– layer 11 and the N layer 12 are formed so as to have the relation G1<G2, the diode 30 is obtained.

(4) If the N– layer 11 and the N layer 12 are formed so as to have the relations G1<G2 and D≧W, the diode 40 is obtained.

The distance W the depletion layer extends due to the reverse voltage can be calculated by simulation or the like.

The second embodiment of the manufacturing method for manufacturing the diode 50 in accordance with the present invention will be described with reference to FIG. 7. FIGS. 7(a'), (b') and (c') are schematic drawings showing distributions of impurity concentrations in the directions of the longitudinal sections shown in FIGS. 7(a), (b) and (c), respectively.

As shown in FIG. 7(a), an N+ semiconductor substrate is prepared as the N+ layer 13, and a plurality of N-type epitaxial layers are grown on the first main surface of the N+ layer 13 so that the impurity concentration gradually decreases to form a semiconductor region which is approximately considered as having an impurity concentration which gradually decreases from the side of the second main surface thereof to the side of the first main surface thereof, i.e., an impurity concentration gradient, as shown in FIG. 7(a'). The thus-formed semiconductor region forms the N layer 12c.

As shown in FIG. 7(b), an N-type epitaxial layer is uniformly grown with a low impurity concentration on the first main surface of the N layer 12c to form the N– layer 11c having no impurity concentration gradient, as shown in FIG. 7(b'). The P layer 14 is formed by ion implantation or diffusion of P-type impurities from the side of the first main surface of the N– layer 11c, as shown in FIG. 7(c).

At this time, the N– layer 11c is formed so as to have a thickness Dc smaller than, or equal to, the width $W_{IRM}$ of the depletion layer at the time the reverse recovery current reaches the peak. The width $W_{IRM}$ of the depletion layer at the time the reverse recovery current reaches the peak can be calculated by simulation or the like.

As shown in FIG. 7(d), the anode electrode 15 and the cathode electrode 16 are then formed, by metal deposition, on the first main surface of the P layer 14 and the second main surface of the N+ layer 13, respectively, to obtain the diode 50.

The third embodiment of the manufacturing method for manufacturing the diodes 10, 20, 30 and 40 in accordance with the present invention will be described with reference to FIG. 8. FIGS. 8(*a'*), (*b'*), (*c'*), (*d'*), (*e'*), (*f'*) and (*g'*) are schematic drawings showing distributions of impurity concentrations in the directions along the longitudinal sections shown in FIGS. 8(*a*), (*b*), (*c*), (*d*), (*e*), (*f*) and (*g*), respectively.

As shown in FIGS. 8(*a*) and (*a'*), a semiconductor substrate is first prepared, and the N− layer 11 is formed by ion implantation or diffusion of N-type impurities from the side of the second main surface of the semiconductor substrate so as to have such an impurity concentration gradient that the concentration gradually decreases from the second main surface to the first main surface thereof. The N− layer 11 is processed to desired impurity concentration gradient G1 and thickness, as shown in FIG. 8(*b'*), by polishing or etching the first and second main surfaces thereof, as shown in FIG. 8(*b*).

Similarly, another semiconductor substrate is prepared, and the N layer 12 is formed by ion implantation or diffusion of N-type impurities from the side of the second main surface of the semiconductor substrate, as shown in FIGS. 8(*c*) and (*c'*). The N layer 12 is processed to desired impurity concentration gradient G2 and thickness, as shown in FIG. 8(*d'*), by polishing or etching the first and second main surfaces thereof, as shown in FIG. 8(*d*).

An N+ semiconductor substrate is prepared as the N+ layer 13, and the second main surface of the N layer 12 is laminated to the first main surface of the N+ layer 13, as shown in FIG. 8(*e*). The second main surface of the N− layer 11 is further laminated to the first main surface of the N layer 12, as shown in FIG. 8(*f*).

As shown in FIG. 8(*g*), the P layer 14 is formed by ion implantation or diffusion of P-type impurities from the side of the first main surface of the N− layer 11. As shown in FIG. 8(*h*), the anode electrode 15 and the cathode electrode 16 are then formed on the first main surface of the P layer 14 and the second main surface of the N+ layer 13, respectively, by metal deposition.

If the thickness of the N− layer 11 is D, and the distance of the depletion layer which extends in the N− layer 11 due to the reverse voltage applied to each of the diodes during the reverse recovery operation is W, the diodes respectively have the following relations between the impurity concentration gradient G1 of the N− layer 11 and the impurity concentration gradient G2 of the N layer 12.

(1) If the N− layer 11 and the N layer 12 are formed so as to have the relation G1≧G2, the diode 10 is obtained.

(2) If the N− layer 11 and the N layer 12 are formed so as to have the relations G1≧G2 and D≧W, the diode 20 is obtained.

(3) If the N− layer 11 and the N layer 12 are formed so as to have the relation G1<G2, the diode 30 is obtained.

(4) If the N− layer 11 and the N layer 12 are formed so as to have the relations G1<G2 and D≧W, the diode 40 is obtained.

The distance W the depletion layer extends due to the reverse voltage can be calculated by simulation of the like.

The fourth embodiment of the manufacturing method for manufacturing the diode 50 in accordance with the present invention will be described with reference to FIGS. 9. FIGS. 9(*a'*), (*b'*), (*c'*), (*d'*) and (*e'*) are schematic drawings showing the distributions of impurity concentrations in the directions along the longitudinal sections shown in FIGS. 9(*a*), (*b*), (*c*), (*d*) and (*e*), respectively.

As shown in FIGS. 9(*a*) and (*a'*), a semiconductor substrate is first prepared, and the N layer 12*c* is formed by ion implantation or diffusion of N-type impurities from the side of the second main surface of the semiconductor substrate so as to have such an impurity concentration gradient that the concentration gradually decreases from the second main surface thereof to the first main surface thereof. The N layer 12*c* is processed to desired impurity concentration gradient and thickness, as shown in FIG. 9(*b'*), by polishing or etching the first and second main surfaces, as shown in FIG. 9(*b*).

An N− semiconductor substrate is prepared as the N− layer 11*c,* and an N+ semiconductor substrate is prepared as the N+ layer 13. As shown in FIG. 9(*c*), the second main surface of the N layer 12*c* is laminated to the first main surface of the N+ layer 13, and, as shown in FIG. 9(*d*), the second main surface of the N− layer 11*c* is laminated to the first main surface of the N layer 12*c*. As shown in FIG. 9(*e*), the P layer 14 is formed by ion implantation or diffusion of P-type impurities from the side of the first main surface of the N− layer 11*c*. At this time, the P layer 14 is formed so that the thickness Dc of the N− layer 11*c* is smaller than, or equal to, the width $W_{IRM}$ of the depletion layer at the time the reverse recovery current reaches the peak.

The width $W_{IRM}$ of the depletion layer at the time the reverse recovery current reaches the peak can be calculated by simulation or the like. As shown in FIG. 9(*f*), the anode electrode 15 and the cathode electrode 16 are then formed by metal deposition on the first main surface of the P layer 14 and the second main surface of the N+ layer 13, respectively, to form the diode 50.

The fifth embodiment of the manufacturing method for manufacturing the diode 50 in accordance with the present invention will be described with reference to FIGS. 10. FIGS. 10(*a'*) and (*b'*) are schematic drawings showing distributions of impurity concentrations in the directions along the longitudinal sections shown in FIGS. 10(*a*) and (*b*), respectively.

The first half of the method in accordance with this embodiment comprises the same steps as those in the fourth embodiment of the manufacturing method shown in FIGS. 9(*a*) and (*b*). Namely, an N+ semiconductor substrate is prepared as the N+ layer 13, and, as shown in FIG. 9(*c*), the second main surface of the N layer 12*c* is laminated to the first main surface of the N+ layer 13. As shown in FIG. 10(*a*), the N− layer 11*c* is then formed by growing an N-type epitaxial layer on the first main surface of the N layer 12*c* so as to have a constant impurity concentration. As shown in FIG. 10(*b*), the P layer 14 is formed by ion implantation or diffusion of P-type impurities from the side of the first main surface of the N− layer 11*c*.

At this time, the P layer 14 is formed so that the thickness Dc of the N− layer 11*c* is smaller than, or equal to, the width $W_{IRM}$ of the depletion layer at the time the reverse recovery current reaches the peak.

The width $W_{IRM}$ of the depletion layer at the time the reverse recovery current reaches the peak can be calculated by simulation or the like. As shown in FIG. 10(*c*), the anode electrode 15 and the cathode electrode 16 are formed on the first main surface of the P layer 14 and the second main surface of the N+ layer 13, respectively, to obtain the diode 50.

In the fourth embodiment of the manufacturing method, when the thickness of the N− semiconductor substrate used as the N− layer 11*c* is excessively small, lamination is impossible. However, the method of the fifth embodiment of the manufacturing method can manufacture a diode even if the thickness of the N– layer 11c is excessively small, and is thus effective as a substitute for the method of the fourth embodiment of the manufacturing method in such a case.

The sixth embodiment of the manufacturing method for manufacturing the diode 50 in accordance with the present invention will be described with reference to FIGS. 11. FIGS. 11(a'), (b'), (c') and (d') are schematic diagrams showing the distributions of impurity concentrations in the directions along the longitudinal sections shown in FIGS. 11(a), (b), (c) and (d), respectively.

As shown in FIGS. 11(a) and (a'), an N– semiconductor substrate is first prepared, and N-type impurities are introduced up to an intermediate portion of the N– semiconductor substrate by ion implantation or diffusion of N-type impurities from the side of the second main surface of the substrate to form the N layer 12c having such an impurity concentration gradient that the concentration gradually decreases from the second main surface thereof to the first main surface thereof, and the N– layer 11c having a constant impurity concentration. As shown in FIG. 11(b), the N layer 12c is processed to desired impurity concentration gradient and thickness, as shown in FIG. 11(b'), by polishing or etching the second main surface of the N layer 12c.

As shown in FIG. 11(c), the N+ layer 13 is formed by growing an N-type epitaxial layer on the second main surface of the N layer 12c so as to have a constant impurity concentration. As shown in FIG. 11(d), the P layer 14 is formed by ion implantation or diffusion of P-type impurities from the side of the first main surface of the N– layer 11c.

At this time, the P layer 14 is formed so that the thickness of Dc of the N– layer 11c is smaller than, or equal to, the width $W_{IRM}$ of the depletion layer at the time the reverse recovery current reaches the peak.

The width $W_{IRM}$ of the depletion layer at the time the reverse recovery current reaches the peak can be calculated by simulation or the like. As shown in FIG. 11(e), the anode electrode 15 and the cathode electrode 16 are formed on the first main surface of the P layer 14 and the second main surface of the N+ layer 13, respectively, by metal deposition to obtain the diode 50.

The seventh embodiment of the manufacturing method for manufacturing the diodes 30 and 40 in accordance with the present invention will be described with reference to FIGS. 12. FIGS. 12(a') and (b') are schematic drawings showing the distributions of impurity concentrations in the directions along the longitudinal sections shown in FIGS. 12(a) and (b), respectively.

The first half of the method in accordance with this embodiment comprises the same steps as those in the third embodiment of the manufacturing method shown in FIGS. 8(a) and (b). Namely, the N– layer 11 having such an impurity concentration gradient G1 that the concentration gradually decreases from the second main surface to the first main surface is obtained. As shown in FIGS. 12(a) and (a'), N-type impurities are introduced up to an intermediate portion of the N– layer 11 by ion implantation or diffusion from the second main surface side of the N– layer 11 to form the N layer 12b having such an impurity concentration gradient G2 that the concentration gradually decreases from the second main surface thereof to the first main surface side thereof, and the N+ layer 13 which is considered as having a substantially constant high impurity concentration near the peak of the impurity distribution.

As shown in FIG. 12 (b), the P layer 14 is then formed by ion implantation or diffusion of P-type impurities from the side of the first main surface of the N– layer 11. As shown in FIG. 12(c), the anode electrode 15 and the cathode electrode 16 are formed on the first main surface of the P layer 14 and the second main surface of the N+ layer 13, respectively, by metal deposition.

If the thickness of the N– layer 11 is D, and the distance the depletion layer extends in the N– layer 11 due to the reverse voltage applied to each of the diodes during the reverse recovery operation is W, the diodes 30 and 40 have the following relations between the impurity concentration gradient G1 of the N– layer 11 and the impurity concentration gradient G2 of the N layer 12b.

(1) If the N– layer 11 and the N layer 12b are formed so as to have the relation G1<G2, the diode 30 is obtained.

(2) If the N– layer 11 and the N layer 12b are formed so as to have the relations G1<G2 and $D \geq W$, the diode 40 is obtained.

The distance W the depletion layer extends due to the reverse voltage can be calculated by simulation or the like.

In the above all embodiments, the forms of the impurity concentration gradients of the N– layer and N layer may be linear as shown by (1), upwardly curved as shown by (2), or downwardly curved as shown by (3) or may have some infection points as shown by (4) in FIG. 13.

Diffusion of a heavy metal such as gold, platinum or the like, irradiation with a radiation of high-energy electron beams or the like, irradiation with a corpuscular beam of protons or, neutrons or the like may be performed for controlling the life time.

A structure in which P type and N type are replaced with each other can produce the same effects as those described above.

Obviously many modifications and variations of the present invention are possible in the light of the above teachings. It is therefore to be understood that within the scope of the appended claims the invention may be practiced otherwise than as specifically described.

What is claimed is:

1. A diode comprising:
    a first semiconductor layer of a first conductivity type having an impurity concentration gradient such that an impurity concentration thereof gradually increases from a first main surface thereof to a second main surface thereof opposite said first main surface;
    a second semiconductor layer of said first conductivity type having a first main surface formed adjacent to said second main surface of said first semiconductor layer and an impurity concentration gradient such that an impurity concentration thereof gradually increases from said first main surface thereof to a second main surface thereof opposite said first main surface;
    a third semiconductor layer of said first conductivity type having a first main surface formed adjacent to said second main surface of said second semiconductor layer, and an impurity concentration greater than, or equal to, that at said second main surface of said second semiconductor layer,
    a fourth semiconductor layer of a second conductivity type provided adjacent to said first main surface of said first semiconductor layer;
    a first main electrode provided adjacent to said fourth semiconductor layer; and
    a second main electrode provided adjacent to said second main surface of said third semiconductor layer opposite said first main surface thereof;

wherein the impurity concentration at said second main surface of said first semiconductor layer is equal to that at said first main surface of said second semiconductor layer, and the impurity concentration gradient of said first semiconductor layer is greater than, or equal to, that of said second semiconductor layer.

2. A diode according to claim 1, wherein a thickness of said first semiconductor layer is greater than, or equal to, a distance a depletion layer extends therein due to a reverse voltage.

3. A diode comprising:

a first semiconductor layer of a first conductivity type having an impurity concentration gradient such that an impurity concentration thereof gradually increases from a first main surface thereof to a second main surface thereof opposite said first main surface;

a second semiconductor layer of said first conductivity type having a first main surface formed adjacent to said second main surface of said first semiconductor layer, and an impurity concentration gradient such that an impurity concentration thereof gradually increases from said first main surface thereof to a second main surface thereof opposite said first main surface;

a third semiconductor layer of said first conductivity type having a first main surface disposed adjacent to said second main surface of said second semiconductor layer, and an impurity concentration greater than, or equal to, that at said second main surface of said second semiconductor layer;

a fourth semiconductor layer of a second conductivity type provided adjacent to said first main surface of said first semiconductor layer;

a first main electrode provided adjacent to said fourth semiconductor layer; and a second main electrode provided adjacent to said second main surface of said third semiconductor layer opposite said first main surface thereof;

wherein the impurity concentration at said second main surface of said first semiconductor layer is equal to that at said first main surface of said second semiconductor layer, and the impurity concentration gradient of said first semiconductor layer is smaller than that of said second semiconductor layer.

4. A diode according to claim 3, wherein a thickness of said first semiconductor layer is greater than, or equal to a distance a depletion layer extends therein due to a reverse voltage.

5. A diode comprising:

a first semiconductor layer of a first conductivity type having an impurity concentration which is constant from a first main surface thereof to a second main surface thereof opposite said first main surface;

a second semiconductor layer of said first conductivity type having a first main surface formed adjacent to said second main surface of said first semiconductor layer, and an impurity concentration gradient such that an impurity concentration thereof gradually increases from the first main surface thereof having an impurity concentration equal to that of said first semiconductor layer to a second main surface thereof opposite said first main surface;

a third semiconductor layer of said first conductivity type having a first main surface formed adjacent to said second main surface of said second semiconductor layer, and an impurity concentration greater than, or equal to, that at said second main surface of said second semiconductor layer;

a fourth semiconductor layer of a second conductivity type provided adjacent to said first main surface of said first semiconductor layer;

a first main electrode provided adjacent to said fourth semiconductor layer; and a second main electrode provided adjacent to said second main surface of said third semiconductor layer opposite said first main surface thereof;

wherein a thickness of said first semiconductor layer is smaller than, or equal to, a width of a depletion layer therein at the time a reverse recovery current reaches a peak.

* * * * *